Oct. 5, 1965 B. K. SMITH 3,210,214

ELECTRICAL CONDUCTIVE PATTERNS

Filed Nov. 29, 1962 3 Sheets-Sheet 1

INVENTOR
Bradford K. Smith
BY
Robert E. Strausser
ATTORNEY

Oct. 5, 1965 B. K. SMITH 3,210,214

ELECTRICAL CONDUCTIVE PATTERNS

Filed Nov. 29, 1962 3 Sheets-Sheet 2

INVENTOR
Bradford K. Smith
BY
Robert E. Strauser
ATTORNEY

Oct. 5, 1965 B. K. SMITH 3,210,214

ELECTRICAL CONDUCTIVE PATTERNS

Filed Nov. 29, 1962 3 Sheets-Sheet 3

INVENTOR
Bradford K. Smith
BY
Robert E. Strausser
ATTORNEY

United States Patent Office

3,210,214

Patented Oct. 5, 1965

3,210,214
ELECTRICAL CONDUCTIVE PATTERNS

Bradford K. Smith, Seneca Falls, N.Y., assignor to Sylvania Electric Products Inc., a corporation of Delaware

Filed Nov. 29, 1962, Ser. No. 240,820
2 Claims. (Cl. 117—212)

This invention relates to a method of forming high resolution conductive film patterns on insulative base materials and more particularly to a process for providing precise electrical conductive patterns on insulated substrates such as are utilized in electroluminescent and photoconductor devices and combination structures thereof.

Heretofore, a method commonly employed in forming thin film conductive patterns on insulated substrate materials comprised the application of a thin film coating of conductive material to the whole of the substrate surface. The desired pattern was produced by positioning a reversal contact mask of a plastic base resist in overlay relationship with the conductive coating and sandblasting to discretely remove the areas of conductive coating exposed by the mask. High resolution was difficult to obtain by this process, and the sandblasting procedure produced a difference in surface texture that was objectionable in certain applications. In another means the substrate surface was covered with an adhering mask of a material such as titanium dioxide before application of the conductive coating. By another method areas of the coated substrate were masked with an acid resistant mask and exposed coating removed by etching with an appropriate acid such as hydrochloric or by a metal such as zinc in the presence of hydrochloric. In addition to being slow, this method also resulted in poor pattern resolution.

Accordingly, an object of this invention is to reduce the aforementioned disadvantages by rapidly forming precise conductive patterns on insulated substrates.

Another object is to facilitate the formation of an electrical conductive pattern having the desired degree of high resolution.

A further object is to produce the desired pattern without substantially altering the surface of the substrate.

The foregoing objects, as well as other objects which will become apparent after reading the following description are achieved in one aspect of the invention by a method for forming precise patterns of conductive films on the surface of an insulated substrate. A thin coating of a readily oxidizable metal in the form of a reversal of the desired pattern is provided on the substrate and the whole of the patterned surface is covered with a continuous film of the conductive film material, which may be tin oxide. Upon firing the substrate, the oxidizable metallic coating and the tin oxide film overlay form reduction products which are removed by an appropriate solvent. As a result, the desired tin oxide conductive pattern remains on the surface of the substrate in the areas formerly void of oxidizable metallic coating coverage.

For a better understanding of the present invention, together with other and further objects, advantages, and capabilities thereof, reference is made to the following disclosure and appended claims in connection with the accompanying drawings in which:

Figure 1:
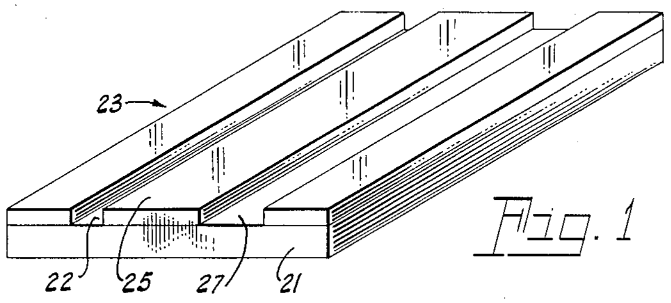
FIG. 1 is a perspective view showing the substrate with the metallic reversal pattern applied.

Referring to FIG. 1, an insulated substrate 21, as for example ceramic or glass or overlay coatings of such, has adheringly disposed in a conventional manner on the surface 22 thereof a thin metallic coating providing a reversal pattern 23.

This pattern 23 on the surface of the substrate comprises discrete areas of deposited metallic coating 25 and intervening areas of surface voids 27 in accordance with the specific pattern design. The metallic coating 25 may be one of several of the appropriate readily oxidizable metals ranking above tin in the electromotive series, having a melting point in excess of 600° C., but under that of the substrate material, and applicable by several well-known methods such as vapor deposition or sputtering. The melting point in excess of 600° C. is preferred since it is desirable to have the reversal pattern formed of a metal that will not soften or melt during the heating and firing processing steps. Typical metals, having the above-mentioned characteristics, would include aluminum, magnesium, manganese, iron, chromium, cobalt, and nickel; but not all of these metals are equally adaptable to the procedure. For example, magnesium and aluminum may be vaporized at temperatures not detrimental to lime glass substrates; while manganese, chromium, iron, cobalt, and nickel, because of their higher vaporization temperatures, are more adaptable to deposition on high silica content glass or ceramic substrates which are capable of adequately withstanding the thermal contact shock of the high temperature vaporized metal.

While not shown, the procedure for achieving the high resolution metallic reversal pattern 23 on the substrate 21 may be accomplished by one of several acceptable methods. One such procedure involves superimposing a positive pattern cut-out mask in adhering adjacency with the substrate surface and vacuum vaporizing an aluminum film thereon. By another method a continuous coating of aluminum is vacuum vaporized over the substrate surface and a high resolution reversal pattern is thence formed thereon by a photoetching technique. The resultant reversal pattern 23 on the surface 22 of the substrate base 21 is shown in FIG. 1.

Figure 5:
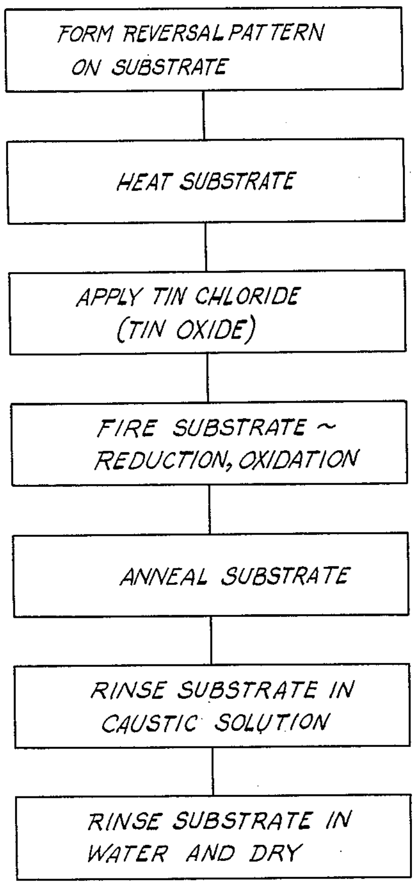
FIG. 5 is a flow diagram showing processing steps in the preferred embodiment of the invention.

As indicated in FIG. 5, heating the substrate follows the formation of the reversal pattern as a preparatory step for achieving the application of a continuous film of tin oxide overlaying the reversal patterned substrate surface. This is accomplished by utilizing a suitable furnace wherein the temperature is regulated so that the melting point of the aluminum reversal pattern 23 is not exceeded and the substrate 21 is not softened to allow embedment of aluminum particles. For the combination of lime glass and aluminum the temperature achieved should be in the range of 550° C. to 600° C.

Figure 2:
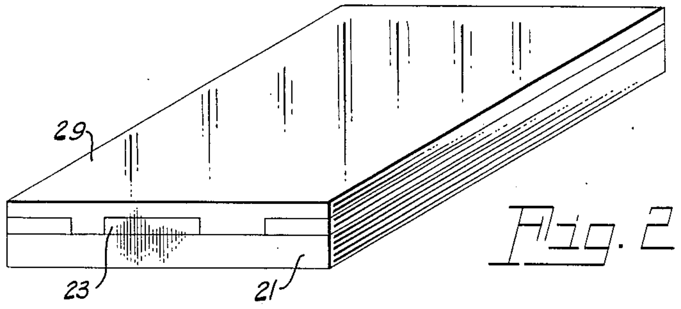
FIG. 2 is a like perspective showing the addition of the tin oxide film.

The time required to reach the desired temperature is on the order of three to five minutes and is dependent upon the furnace design, temperature gradient, substrate size, and type of support material utilized. Upon attaining the desired temperature, the patterned substrate is removed from the furnace to an oxidizing atmosphere where the surface is sprayed with a tin chloride solution. In the presence of the heated substrate and the ambient oxygen the tin chloride decomposes to form a continuous film of tin oxide 29 contiguously overlaying the aluminum reversal pattern 23 and void areas 27 on the substrate 21 as illustrated in FIG. 2. The amount of aluminum should be substantially stoichiometrically equivalent to the tin oxide present.

To consummate the oxidation of the aluminum reversal pattern and the reduction of the overlay film of tin oxide, the coated substrate is again placed in an appropriate firing furnace and heated to an elevated temperature within the range of 550° C. to 600° C. The variables affecting this second heating or firing step are similar to those encountered in the first heating plus variations in the tin oxide and aluminum thicknesses; therefore the firing time required for reducing the tin oxide to tin and resultant oxidation of the aluminum underlay will vary in the range of three to five minutes. As previously mentioned, the thicknesses of the aluminum coating underlay and the tin oxide film overlay are preferably substantially equal so that there is no gross excess of either material remaining after the reduction-oxidation firing step.

Figure 3:
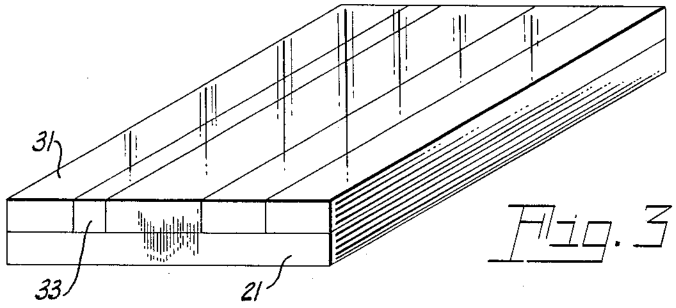
FIG. 3 is a similar view illustrating the resultant reduction of the tin oxide film during the firing step.

It will be noted in FIG. 3 that as a result of the firing step there is formed on the substrate surface a reversal pattern 31 comprising the reduction and oxidation products, i.e., tin and aluminum oxide, and any vestigial amount of remaining aluminum. A contiguous tin oxide positive pattern 33 is also present and has not been affected by the firing step.

To eliminate the formation of strains, the substrate is annealed in accordance with the composition and thickness of the respective substrate material.

Figure 4:
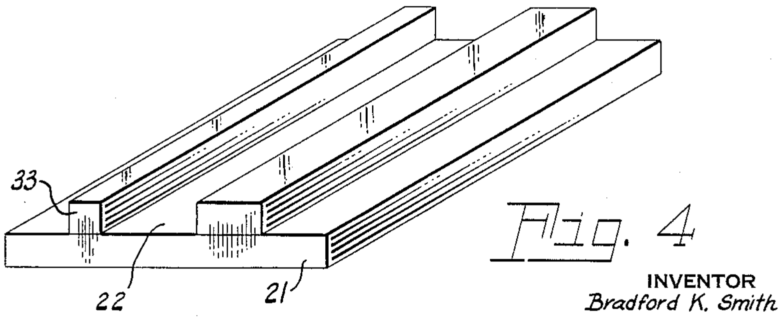
FIG. 4 is a perspective showing the substrate with the final positive pattern thereon.

After cooling and annealing, the substrate is rinsed in a suitable cleaning solution as for example a caustic like sodium hydroxide or an acid such as sulfuric, hydrochloric, or nitric. This rinsing effects chemical removal of the reversal pattern 31 comprising the loosely bonded granular mixture of aluminum oxide, tin, and any vestigial aluminum present. Since the molecular structure of the mixture exhibits weak adhesive characteristics, it is easily attacked by the caustic or acidic rinse. As desired, the precise positive pattern 33 of tin oxide is not chemically affected and remains on the surface 22 of substrate 21 as shown in FIG. 4. As indicated in FIG. 5, the patterning process is complete after subsequent water rinsing and drying which does not alter the positive pattern.

As previously mentioned, various metals other than aluminum may be utilized in forming the initial reversal pattern 23 on the substrate. The caustic or acidic rinse solution necessary for the removal of the reversal pattern reaction products 31 from the substrate 21 may comprise sodium hydroxide when magnesium is utilized in providing the pattern. In applications where the reversal pattern 23 is formed of manganese, chromium, iron, cobalt, or nickel, the chemical reactions necessary for pattern 31 removal may be adequately initiated by the use of an appropriate acid such as hydrochloric or nitric.

Figure 10:
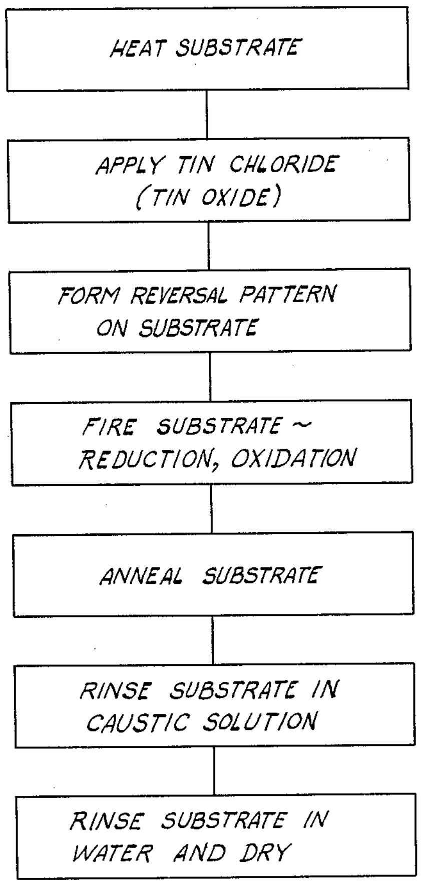
FIG. 10 is a flow diagram showing the processing steps in an alternate embodiment of the invention.
Figure 6:
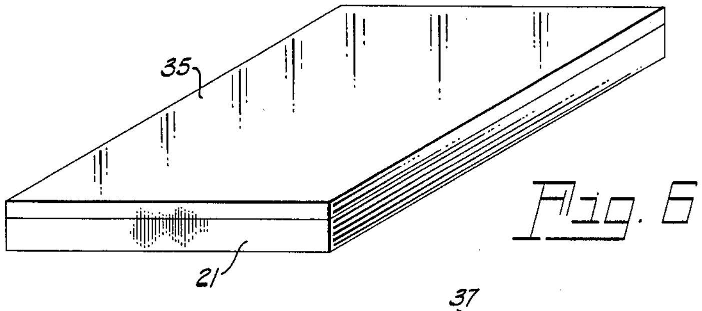
FIG. 6 is a perspective view of an initial step in an alternate method showing the substrate with a tin oxide film applied.
Figure 7:
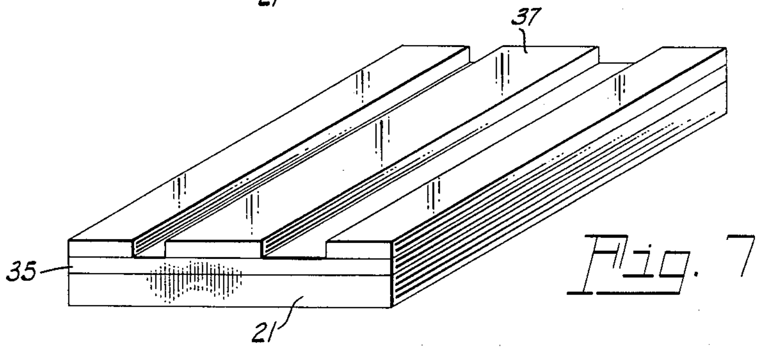
FIG. 7 is a similar perspective showing the addition of the reversal pattern.
Figure 8:
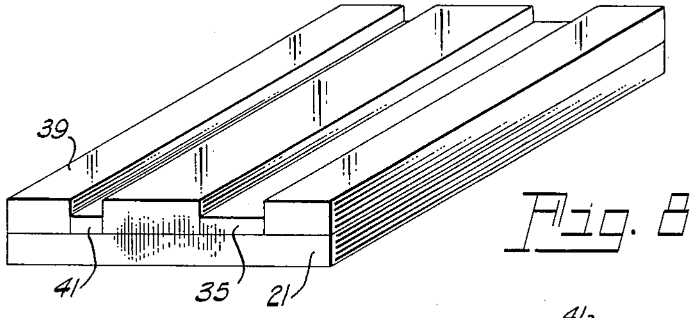
FIG. 8 is a like view illustrating the resultant reduction of the tin oxide film during the firing step.
Figure 9:
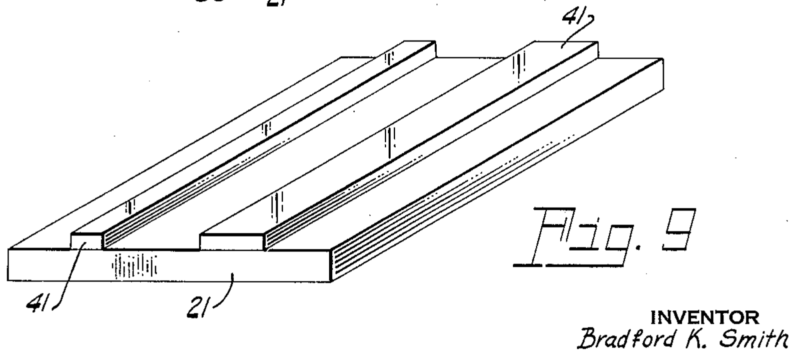
FIG. 9 is a perspective showing the positive pattern on the substrate.

An alternate method of forming a precise high resolution pattern of electrical conductive material involves some sequential variations of the preferred embodiment previously described. As indicated in FIG. 10, the insulated substrate 21 is initially heated to an elevated temperature within the range of 550° C. to 600° C. and then subjected to vaporous tin chloride in an oxidizing atmosphere whereby there is provided thereon, by chemical reaction, a continuous film 35 of conductive tin oxide as shown in FIG. 6. Upon this film an overlay reversal or negative 37 of the desired pattern is formed by discretely depositing thereon a coating of a readily oxidizable metal ranking above tin in the electromotiove series, having a melting point in excess of 600° C. but under the melting temperature of the substrate material. Typical metals are those previously listed in describing the preferred embodiment; namely, aluminum, magnesium, manganese, iron, chromium, cobalt, and nickel. Again, aluminum is quite acceptable to the application and will be utilized in describing this alternate method. The overlay reversal pattern 37 is formed in a conventional manner previously described. The substrate 21 bearing the continuous film 35 of tin oxide and the overlay aluminum reversal pattern 37 is illustrated in FIG. 7. The coated substrate is then fired as in the preferred embodiment to effect oxidation of the aluminum coating and reduction of the tin oxide film thereby forming a reversal pattern 39 of the reaction products, i.e., aluminum oxide, tin, and vestigial aluminum. As indicated in FIG. 8, the tin oxide which was not overlaid with aluminum is not chemically changed by the firing and forms a positive pattern 41 contiguous with the reversal pattern 39. After annealing, the chemical rinse, caustic or acidic, disposes of the reversal or negative pattern leaving the desired precise high resolution tin oxide positive pattern 41 on substrate 21 as shown in FIG. 9.

Thus there has been described two embodiments of the invention whereby precise conductive patterns may be readily and accurately formed on insulated substrates. Although not known for certain, the chemical and physical structures of the composite reduction and oxidation products are selectively attacked by the caustic or acidic solutions thereby leaving the positive pattern of electrically conductive tin oxide. Desired patterns of high resolution are advantageously achieved without substantially altering the surface of the substrate.

While there has been shown and described what is at present considered the preferred embodiments of the invention, it will be obvious to those skilled in the art that various changes and modifications may be made therein without departing from the scope of the invention as defined by the appended claims.

Having thus described the invention, what is claimed is:

1. A method for forming a positive pattern of electrical conductive material on an insulated substrate comprising the steps of:

forming a reversal of the positive pattern on said substrates by depositing thereon a coating of aluminum;

heating said substrate bearing said reversal pattern to an elevated temperature within the range of 550° C. to 600° C.;

applying vaporous tin chloride to said heated pattern-bearing substrate in an oxidizing atmosphere to provide a continuous film of reducible tin oxide in contact therewith;

oxidizing said aluminum to provide aluminum oxide and reducing said reducible tin oxide in contact therewith to provide residual tin thereby forming a reversal pattern comprising said aluminum oxide and said residual tin; and rinsing said substrate in a caustic solution of sodium hydroxide to selectively remove said reversal pattern of said aluminum oxide and said residual tin from said substrate to form the electrically conductive positive pattern.

2. A method for forming a positive pattern of electrical conductive material on an insulated substrate comprising the steps of:

heating said substrate to an elevated temperature within the range of 550° C. to 600° C.;

applying vaporous tin chloride to said heated substrate in an oxidizing atmosphere to provide thereon a continuous film of reducible tin oxide;

forming a reversal of the positive pattern on said film of reducible tin oxide by depositing thereon a coating of aluminum;

oxidizing said aluminum to provide aluminum oxide and reducing said tin oxide in contact therewith to provide residual tin thereby forming a reversal pattern comprising said aluminum oxide and said residual tin; and rinsing said substrate in a caustic solution of sodium hydroxide to selectively remove said reversal pattern of said aluminum oxide and said residual tin from said substrate to form the electrically conductive positive pattern.

References Cited by the Examiner

UNITED STATES PATENTS

| | | | |
|---|---|---|---|
| 2,559,389 | 7/51 | Beeber et al. | 117—5.5 |
| 2,728,693 | 12/55 | Cado | 117—212 |

FOREIGN PATENTS

| | | |
|---|---|---|
| 768,548 | 2/57 | Great Britain. |

RICHARD D. NEVIUS, *Primary Examiner.*

WILLIAM D. MARTIN, *Examiner.*